US008180607B2

(12) United States Patent
Rassaian et al.

(10) Patent No.: US 8,180,607 B2
(45) Date of Patent: May 15, 2012

(54) ACOUSTIC MODELING METHOD

(75) Inventors: Mostafa Rassaian, Bellevue, WA (US); David William Twigg, Federal Way, WA (US)

(73) Assignee: The Boeing Company, Chicago, IL (US)

(*) Notice: Subject to any disclaimer, the term of this patent is extended or adjusted under 35 U.S.C. 154(b) by 293 days.

(21) Appl. No.: 12/580,131

(22) Filed: Oct. 15, 2009

(65) Prior Publication Data

US 2010/0036649 A1    Feb. 11, 2010

Related U.S. Application Data

(63) Continuation-in-part of application No. 10/898,235, filed on Jul. 26, 2004, now Pat. No. 7,623,994.

(51) Int. Cl.
G06F 7/60 (2006.01)
G06F 17/10 (2006.01)
G06G 7/48 (2006.01)

(52) U.S. Cl. ................................. 703/2; 703/6
(58) Field of Classification Search ................... 703/2, 6
See application file for complete search history.

(56) References Cited

U.S. PATENT DOCUMENTS

| | | | |
|---|---|---|---|
| 5,243,665 A | 9/1993 | Maney et al. | |
| 5,784,339 A * | 7/1998 | Woodsum et al. | 367/134 |
| 6,069,634 A | 5/2000 | Gibson | |
| 6,687,659 B1 | 2/2004 | Shen | |
| 6,728,664 B1 | 4/2004 | Fouad | |
| 6,751,580 B1 | 6/2004 | Cope et al. | |
| 2002/0010399 A1 | 1/2002 | Konofagou et al. | |

OTHER PUBLICATIONS

Anton V. Mobley, et al., "An Object Oriented Approach to Geometry Defeaturing for Finite Element Meshing", Proc. 7th Int. Meshing Roundtable, Oct. 26, 1998, 17 pages, XP 002378996.
Malcolm J. Panthaki et al., "An Object-Oriented Virtual Geometry Interface", Proc. 61n AnnualInt. Meshing Roundtable, Oct. 13, 1997, 15 pages, XP 002378997.
S. Agostinelli, et al., "Geant4-a simulation toolkit", Nuclear Instruments and Methods in Physics Research, Jul. 1, 2003, pp. 250-303, vol. 506, No. 3, XP 004431463.
Marc Levoy, "Efficient Ray Tracing of Volume Data", ACM Transactions on Graphics, Jul. 1990, pp. 245-261, vol. 9, No. 3, XP002913630.
Steffen Marburg, "A general concept for design modification of shell meshes in structural-acoustic optimization—Part I: formulation of the concept", Finite Elements in Analysis and Design, Jun. 2002, paQes 725-735 vol. 38, No. 8 XP002379283.

(Continued)

*Primary Examiner* — Paul Rodriguez
*Assistant Examiner* — Andre Pierre Louis

(57) ABSTRACT

A cross-spectral correlation function of a structure may be determined by providing a finite element model of the structure having a plurality of elements each having a centroid. A plurality of composite centroids may be determined wherein each one of the composite centroids is based on at least one of the elements. The cross-spectral correlation function between at least one pair of the elements in the finite element model may be assigned to be the cross-spectral correlation function of the composite centroids that include the centroids of the elements. If the pair of elements is included in the same composite centroid, then the cross-spectral correlation function between the elements is assigned to be the autocorrelation function of the composite centroid that includes the pair of elements.

25 Claims, 10 Drawing Sheets

OTHER PUBLICATIONS

Steffen Marburg, et al., "A general concept for design modification of shell meshes in structuralacoustic optimization—Part II: Application to a floor panel in sedan interior noise problems", Finite Elements in Analysis and DesiQn, Jun. 2002 paQes 737-754 vol. 38, No. 8 XPOO2379284.

J.A. Eaton, et al., "Application of the Finite Element Method to Acoustic Scattering Problems", MIA Journal, Jan. 1, 1996. pp. 29-34, vol. 34, No. 1, XP009065980.

R.M. Koch, M.H. Gross, F.R. Carls, D.F. Von Buren, G. Frankhauser, Y.I.H. Parish, "Simulating Facial Surgery Using Finite Element Models", ACM 1996, ACM-0-89791-746-4/96/008, pp. 421-428.

* cited by examiner

ACOUSTIC MODELING METHOD

CROSS-REFERENCE TO RELATED APPLICATIONS

The present application is a continuation-in-part application of pending application Ser. No. 10/898,235 filed on Jul. 26, 2004, now U.S. Pat. No. 7,623,994, and entitled OBJECT-ORIENTED ACOUSTIC MODELING TOOLS AND METHODS, the entire contents of which is expressly incorporated by reference.

STATEMENT RE: FEDERALLY SPONSORED RESEARCH/DEVELOPMENT (Not Applicable)

FIELD

The present disclosure relates generally to methods and systems for conducting acoustic studies using finite element modeling.

BACKGROUND

While the Finite Element Model (FEM) is known as a tool useful for determining the integrity of a given mechanical structure, the Finite Element Model also has a number of other uses. For example, the same FEM that can be used to predict the structural integrity of an aircraft door or window can also be used to develop an acoustic model to predict how the door or window will conduct sound. Unfortunately, FEMs rarely lend themselves to computational efficiency, and when used to predict acoustic behavior, the computational power required to develop a FEM-based acoustic model increases exponentially with every added element. Accordingly, new methods and systems related to improving the computational requirements of acoustic models are desirable.

SUMMARY

Provided is a method and apparatus for determining a cross-spectral correlation function of a structure for use in computing an acoustic response of the structure to a known acoustic field acting upon the structure. The method may be performed using computer-executable instructions stored on a computer readable storage media that, when executed on a processor, retrieve a finite element model of the structure. The finite element model may include a plurality of elements with each element having a centroid. A plurality of composite centroids may be determined wherein each one of the composite centroids may be based on at least one of the elements and wherein each composite centroid has a spatial position and area. The cross-spectral correlation function of the structure may be determined based on the composite centroids.

The method may further include determining the cross-spectral correlation function between at least one pair of the elements in the finite element model by assigning the cross-spectral correlation function between the elements of the pair to be the cross-spectral correlation function of the structure for the composite centroids to which the pair of elements belongs if the composite centroids are distinct. If the element pair belongs to the same composite centroid, then the cross-spectral correlation function between the elements may be assigned to be an autocorrelation function of the composite centroid. The cross-spectral correlation function between the pairs of the elements may be used to determine the acoustic response of the structure to the known acoustic field.

In a further embodiment, the present disclosure includes an apparatus for determining a cross-spectral correlation function for use in computing the acoustic response of the structure to the known acoustic field. The apparatus may comprise a processor and a memory containing computer-executable instructions that, when executed on the processor, perform the method comprising the steps of retrieving the finite element model having the plurality of elements with each element having a centroid. A plurality of composite centroids may be determined wherein each one of the composite centroids may be based on at least one of the elements.

The cross-spectral correlation function of the structure may be determined based on the composite centroids and may be transferred from the composite centroids to the underlying finite element model for use in the acoustic analysis. In this regard, the method may include determining the cross-spectral correlation function between at least one pair of the elements in the finite element model by determining the respective composite centroid to which each one of the elements of the pair belongs.

Depending upon the composite centroid to which the centroid of the elements belongs, the cross-spectral correlation function between the elements of the pair may be assigned to be the cross-spectral correlation function of the structure for the composite centroids to which the pair of elements belongs if the composite centroids are distinct. If the centroid of the elements is common to a single centroid, then the cross-spectral correlation function between the elements of the pair may be assigned to be the autocorrelation function of the composite centroid. The cross-spectral correlation function may be used to determine the acoustic response of the structure to the known acoustic field.

The present disclosure further includes a computer-readable storage medium for storing a plurality of instructions that, when executed by a processor, enable a processor-based system to operate on the finite element model. The finite element model has the plurality of elements which may be used with the cross-spectral correlation function to predict the acoustic response of the structure. The instructions stored within the computer-readable storage medium may include at least one routine that, when executed by the processor, determines a cross-spectral correlation function for use in computing an acoustic response of the structure using the elements of the finite element model based upon composite centroids of the elements stored on the computer-readable storage medium.

The instructions may also include a means for determining the cross-spectral correlation function of the structure based on the composite centroids. Also included with the computer-readable storage medium may be a means for determining the cross-spectral correlation function between at least one pair of the elements in the finite element model by assigning the cross-spectral correlation function between the elements of the pair to be the cross-spectral correlation function of the structure for the composite centroids to which the pair of elements belongs if the composite centroids are distinct.

Also included may be a means for assigning the cross-spectral correlation function between the elements of the pair to be the autocorrelation function of the composite centroid if the composite centroid is common to the elements of the pair. The cross-spectral correlation function may be used in computing the acoustic response of the structure to the known acoustic field.

The features, functions and advantages that have been discussed can be achieved independently in various embodiments of the present disclosure or may be combined in yet other embodiments, further details of which can be seen with reference to the following description and drawings below.

BRIEF DESCRIPTION OF THE DRAWINGS

These and other features of the present disclosure will become more apparent upon reference to the drawings wherein like numbers refer to like parts throughout and wherein.

DETAILED DESCRIPTION

The inventors of the disclosed methods and systems have created an approach to creating acoustic models using a fraction of the computational power required by conventional approaches. Other advantages of the various embodiments include, but are not limited to, the capacity to use object-oriented computer code to perform acoustic modeling, thus increasing the portability and reliability of acoustic modeling systems.

Figure 1:
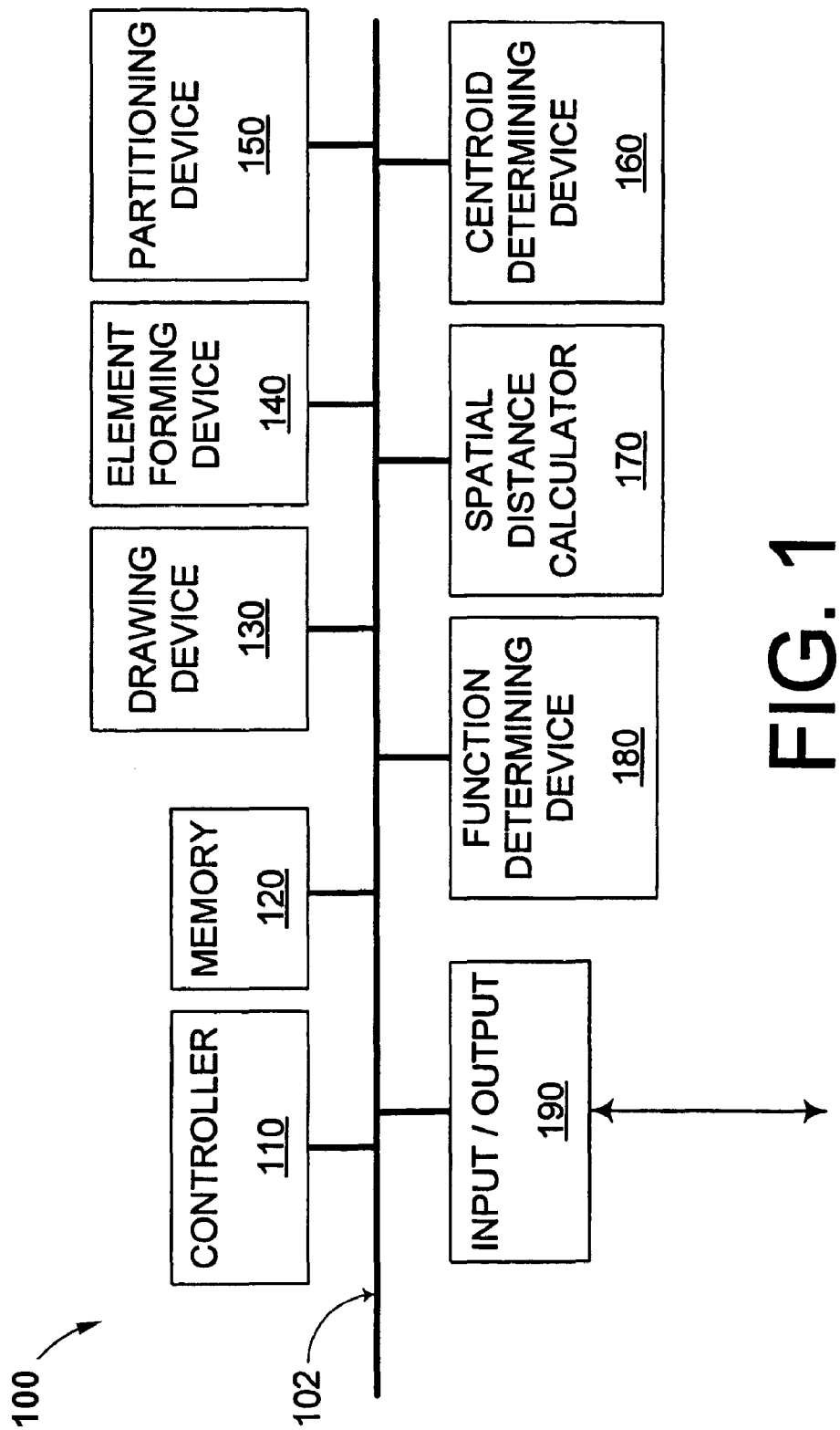
FIG. 1 is a block diagram of an apparatus capable of efficiently forming an acoustic model based on a finite element model of a structure.

FIG. 1 is an exemplary modeling device 100 according to the disclosed methods and systems. As shown in FIG. 1, the exemplary modeling device 100 includes a controller 110, a memory 120, a drawing device 130, an element-forming device 140, a partitioning device 150, a centroid-determining device 160, a spatial distance calculator 170, a function-determining device 180 and an input/output device 190. The above components 110-190 are coupled together by control/data bus 102.

Although the exemplary modeling device 100 of FIG. 1 uses a bussed architecture, it should be appreciated that any other architecture may be used as is well known to those of ordinary skill in the art.

It also should be appreciated that some of the above-listed components can take the form of software/firmware routines residing in memory 120 and capable of being executed by the controller 110. Further, it should be understood that the functions of any or all of components 130-180 can be accomplished using object-oriented software, thus increasing portability, software stability and a host of other advantages not available with non-object-oriented software.

In operation, an operator using the modeling-device 100 can first create a structure of interest, which may or may not take the form of a wire-frame geometry; a "wire-frame geometry" being a form of skeletal outline of the structure. Subsequent to creating a structure, the operator can access the element-forming device 140 which may divide the structure into a plurality of elements.

Figure 2:
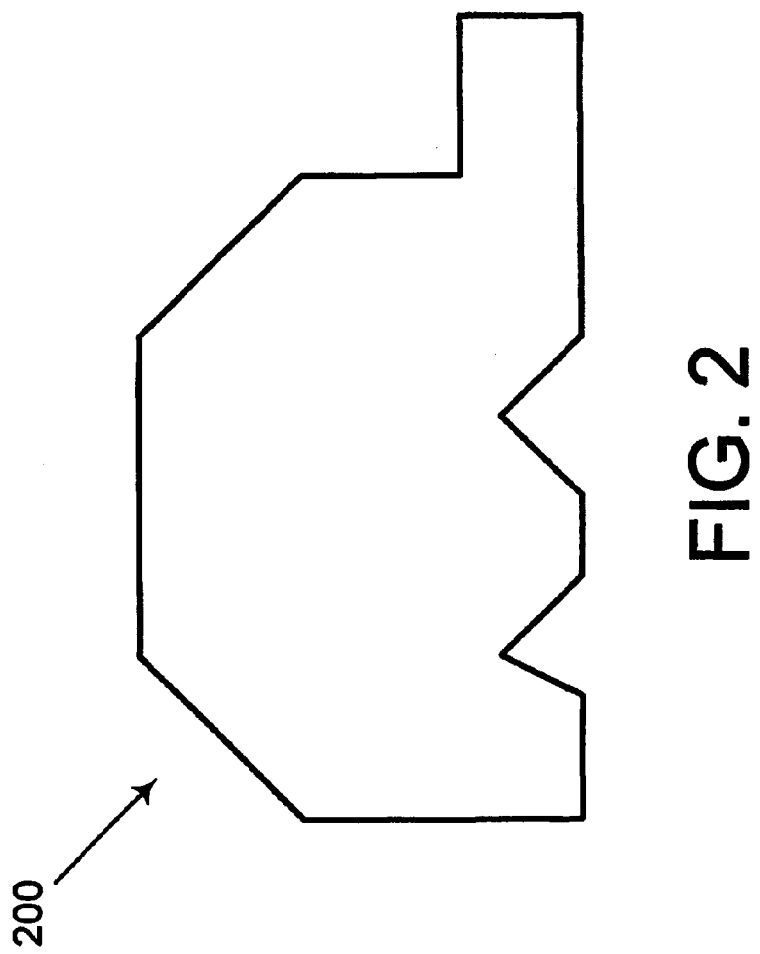
FIG. 2 depicts an exemplary structure.
Figure 3:
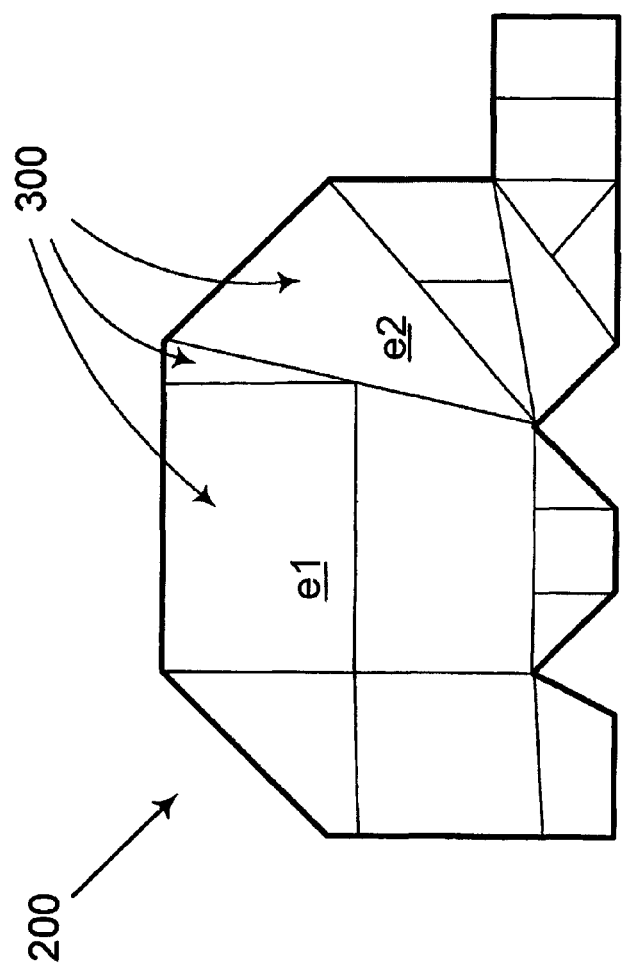
FIG. 3 depicts the structure of FIG. 2 divided into elements.

FIG. 2 depicts an exemplary structure 200 that for the purpose of this disclosure is useable to explain the function of the various components of FIG. 1. FIG. 3 depicts the structure 200 of FIG. 2 divided into 17 separate elements 300. As shown in FIG. 3, the various elements 300 do not need any special structure, such as a mesh-like regular structure of elements that might be automatically produced from a wire-frame geometry. While the apparatus 100 of FIG. 1 is capable of generating a FEM by virtue of the drawing device 130 and the element-forming device 140, it should be appreciated that the apparatus 100 can alternatively import any number of finite element models via input/output device 190 as may be desired or useful.

Figure 4:
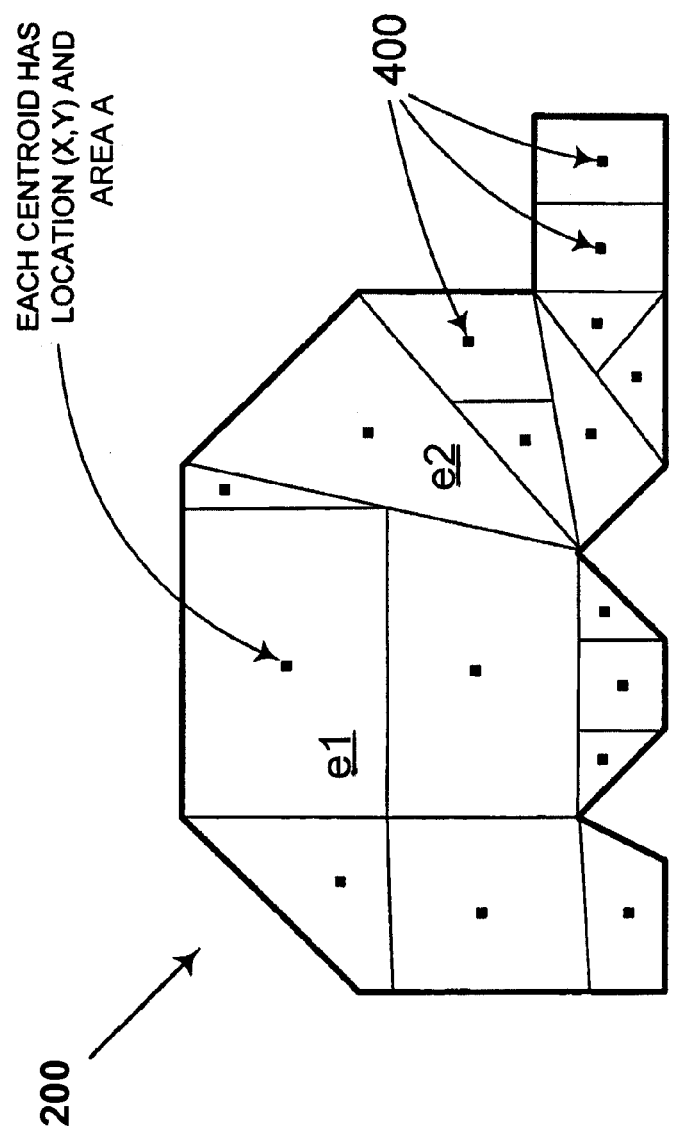
FIG. 4 depicts the centroids of the elements of FIG. 3.

Regardless of a structure's origin, once the elements are formed, the partitioning device 150 can be used to determine the centroids of each element (assuming that such centroids are not pre-defined in an imported FEM). Referring to FIG. 4 which depicts the centroid 400 for each element 300, it should be noted that for the purposes of this disclosure, a "centroid" can be defined as a point representing the spatial mean position of a body's area. For example, a centroid of a circle or square (having uniform density) will be at the exact center of the circle/square.

In addition to an X-Y spatial position for each polygon (or X-Y-Z position for three-dimensional representations, e.g., polyhedrons), a centroid can also be represented by an area A that can vary from element to element. For instance, referring to FIG. 4, it is apparent that the centroid of the top-center rectangle can have a greater area than the centroid of the much smaller rectangle located at the lower-rightmost portion of structure 200.

Once all the centroids 400 are determined, the partitioning device 150 can partition the elements 300 into separate "composite" sets of elements using partitioning device 150. Generally, such partitioning can be done in a number of ways. For example, in various embodiments, an operator can look for clusters of closely-spaced centroids and define composite sets as a matter of personal judgment. In other embodiments, composite sets can be defined using any number of useful partitioning tools, such as software capable of detecting clusters and so on.

Regardless of the various useable partitioning approaches that can be used, the inventors of the disclosed methods and systems have developed an approach that not only reduces overall computational requirements, but lends itself to manipulation by object-oriented code. For example, referring to FIG. 5A, it is apparent that array 500 of regularly-spaced rectangles can be superimposed over structure 200, and that the centroids 400 of each element 300 will fall within one of the available rectangles $\{(1, 1), (1, 2) \ldots (2, 4)\}$.

While a 2-by-4 array is used for the present example, it should be appreciated that for modeling any particular structure, arrays having greater resolution, i.e., more constituent parts, can be used to provide greater accuracy acoustic models at the cost of greater computational requirements, while smaller arrays can be used to produce models of lesser accuracy but at the benefit of greatly reduced computational requirements. While choosing the optimal appropriate sized array can be an issue of judgment, the inventors of the disclosed methods and systems have discovered that an appropriately-sized array can result in an acoustic model requiring less than 10% of the processing requirement for calculating the cross-spectral correlation function for an acoustic model compared to calculations based on individual elements of the underlying finite element mode land resulting in a loss of accuracy of less than 2%.

Again returning to FIG. 5A, it should be appreciated that the M-by-N rectangular-nature of array 500 also lends itself to manipulation by object-oriented code.

An "object" is a software module that contains a collection of related procedures and data. Each object can have a basic purpose or function that it performs. Unlike non-object oriented software where code and data are separate, each object contains the data used in performing its function as well as the code. It is self-contained. Constructed properly, object-oriented software has many advantages over non-object oriented software. For example, object-oriented software is more stable and less prone to crashing when changes are made, particularly in the case of complex systems. Because the code and data are co-located within each object, they don't fall out of synch when software is changed, which is a common problem of traditional non-object-oriented systems. By virtue of using an M-by-N array, the present systems and methods can provide a set of object-oriented software routines that can be consistently reused with minimum software development and maintenance costs. Such object-oriented routines may be used in any portion of any process or method disclosed herein.

Figures 5A, 5B:
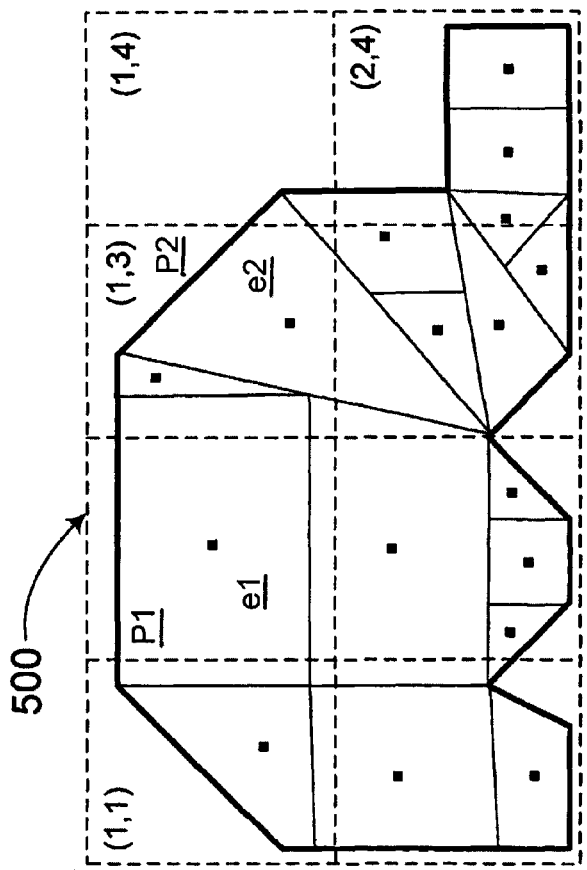
FIGS. 5A and 5B depict a partitioning of the elements shown in FIGS. 3-4.

Returning to FIG. 1, the partitioning device 150 of the present methods and systems can partition the various elements 200 based on where their centroids 300 fall in relation to the various rectangles of array 500. As can be seen by FIG. 5A, each centroid 300 will generally fall into a distinct rectangle (or otherwise relegated to an appropriate rectangle given a tie) in a manner as to partition the various element 300 into disjoint sets of elements. In mathematics, two sets are considered disjoint if they have no elements in common. Referring to table 510 of FIG. 5B, it is demonstrated that the array 500 of FIG. 5A can be used to partition the original 17 elements into 8 disjoint sets with rectangle (1, 1) having 1 element, rectangle (1, 2) having 1 element, rectangle (1, 3) having 2 elements and so on.

Again referring to FIG. 1, once the various elements of a structure are partitioned, the centroid determining device 160 can be used to determine the "composite centroid" for each set: a "composite centroid" being defined as the centroid for all elements of a given set. Generally, such a composite centroid can be determined using just the spatial position and area of each element of a set. However, the particular approach to determining composite centroids can take any number of forms as long as accurate results are produced.

Figure 6A:
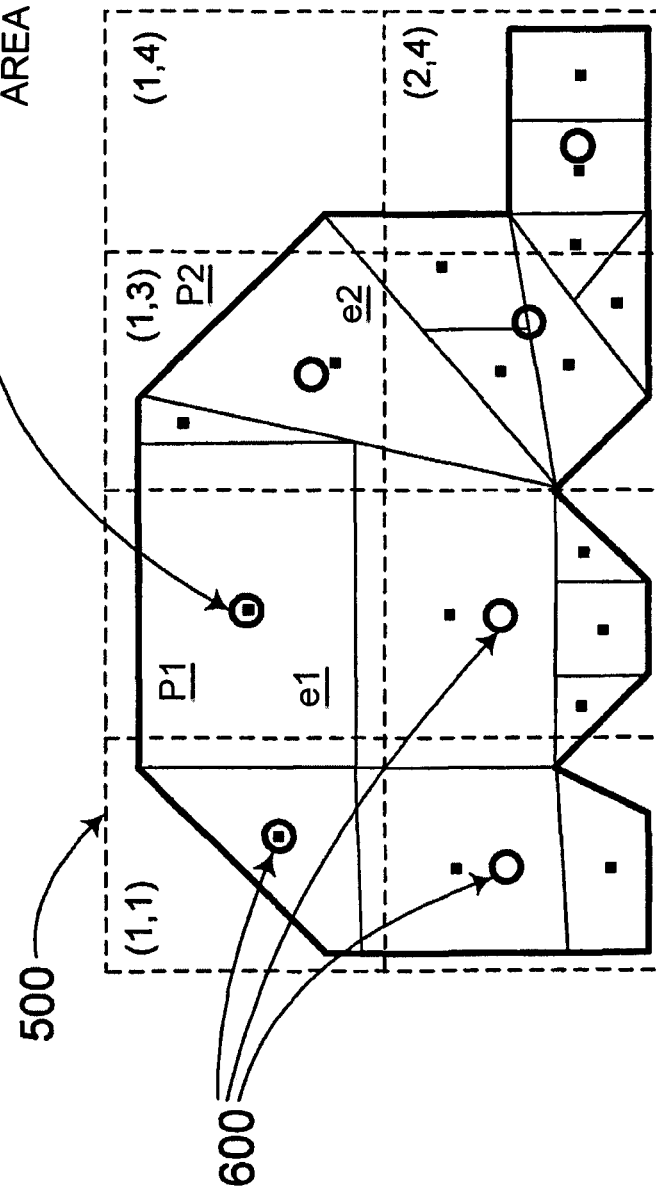
FIGS. 6A and 6B depict composite centroids generated from the partitioned elements of FIG. 5A.

FIG. 6A depicts the composite centroids 600 (shown as small circles) for the various composite sets of elements (acknowledging that set (1, 4) will have no composite centroid). The table 610 subsequently indicates that each composite centroid 600 of FIG. 6A will have a spatial position $(X_{11}, Y_{11})$, $(X_{12}, Y_{12})$ . . . $(X_{24}, Y_{24})$ as well as an area $A_{11}$, $A_{12}$ . . . $A_{24}$.

Figure 7:
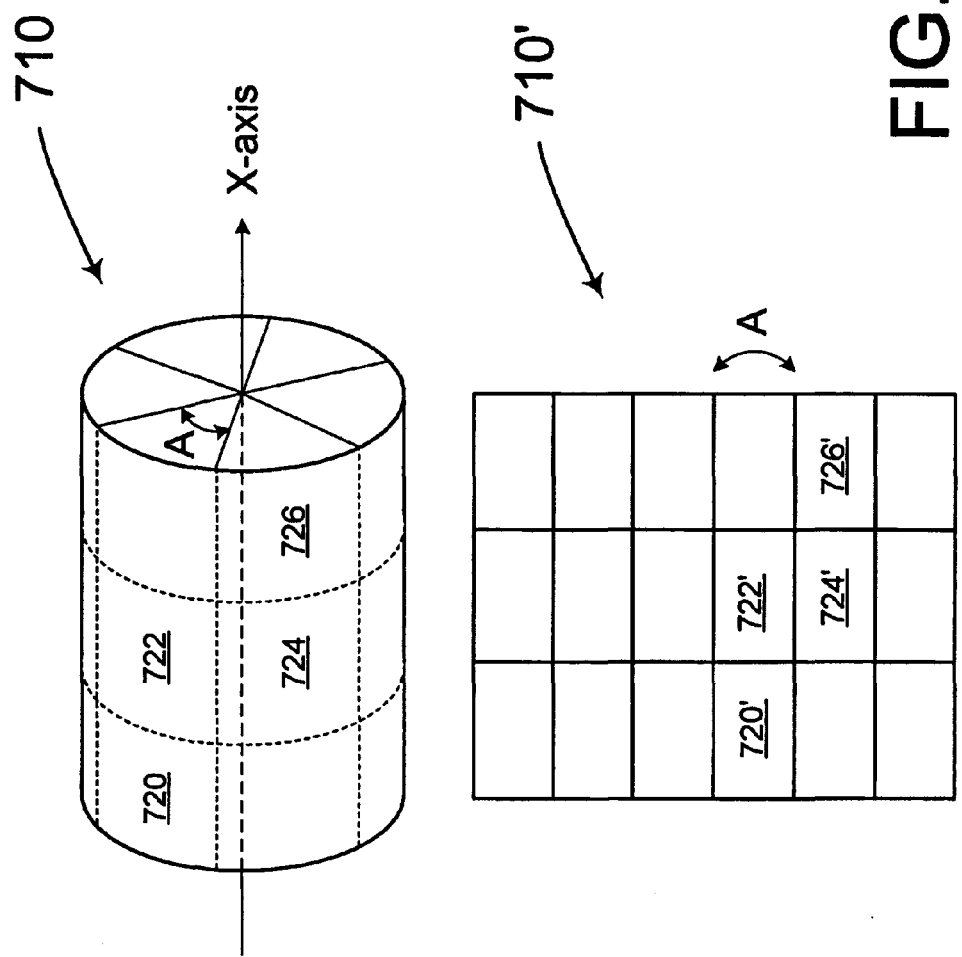
FIG. 7 depicts a geometric transform from cylindrical to Cartesian space useful for forming an acoustic model.

In addition to working in structures using Cartesian coordinates, it should be appreciated that it can be advantageous or necessary to work in other coordinate systems such as the coordinate systems of cylindrical or spherical spaces. FIG. 7 depicts such an example where the methods and systems of the present disclosure are adapted for a cylindrical structure 710. As shown in FIG. 7, the cylindrical structure 710 can be represented by a coordinate system having an X-axis, a Y-distance extending from the X-axis and an angle θ circling about the X-axis.

As is also shown in FIG. 7, the cylindrical structure 710 can be divided into a number of wedges having angle A and the wedges further can be divided into sections such as sections 720-726. As should be apparent in FIG. 7, the cylindrical structure 710 can be represented using an M-by-N rectangular-array 710' having various elements including elements 720'-724', which represent respective sections 720-724. As should also be apparent from FIG. 7, the cylindrical structure 710 can now be analyzed in a fashion similar to the structure 200 of FIG. 2.

Returning again to FIG. 1, once determined, the spatial positions of the composite centroids can then be provided to the spatial distance calculator 170. The spatial distance calculator 170, in turn, can calculate the distances between each composite centroid. Subsequently, the composite centroid spatial positions, composite centroid areas and relative distances between centroids can be provided to the function determining device 180. The function determining device 180, in turn, can determine the cross-spectral correlation function of the structure of interest. The cross-spectral correlation function of a structure can be thought of as a model that describes/predicts how the structure will react to an acoustic stimulus, such as an external noise source or source of excitation. The exemplary function determining device 180 can use any variation of a cross-spectral correlation process as is well-known in the relevant arts. While the devices 130, 140, 150, 160, 170 and 180 can take the form of a number of object-oriented routines, it should be appreciated that, in various embodiments, the particular approach and devices used to developing acoustic models can vary as desired or otherwise required.

Figure 8:
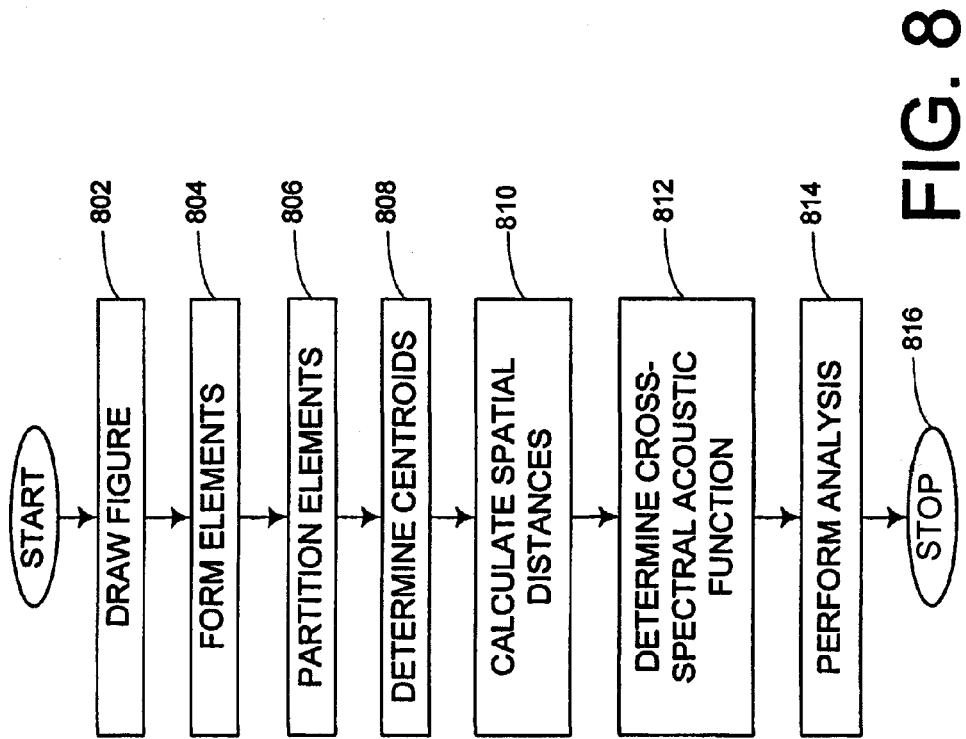
FIG. 8 is a flowchart outlining an exemplary operation for forming finite element models.

FIG. 8 is a flowchart outlining an exemplary operation according to the present disclosure for developing an acoustic model. The process starts at step 802 where a structure is created. Next, in step 804, the structure of step 802 is divided into elements as might be found in a finite element model (FEM) for example. Then, in step 806, the elements are partitioned into sets. Control continues to step 808.

In step 808, composite centroids are determined for each partitioned set of finite elements of step 806. Next, in step 810, the spatial distances between composite centroids are determined. Then, in step 812, an acoustic function of the structure of step 802 is determined using the spatial distance information generated in step 810 as well as the composite centroid data itself. Control continues to step 814.

In step 814 of FIG. 8, an acoustic analysis of the structure of step 802 can be performed using the acoustic model function (i.e., the cross-spectral correlation function) of the structure based upon the composite centroids in step 812 prior to stopping the process in step 816. In the acoustic analysis illustrated in FIG. 9, the acoustic response of the structure can be determined based upon a known acoustic field acting on the structure and which may be generated by a source of excitation. The acoustic response can be determined based upon the cross-spectral correlation function as described above and which can be transferred from the composite centroids to the underlying finite element model for use in the acoustic analysis as described in detail below.

Figure 9:
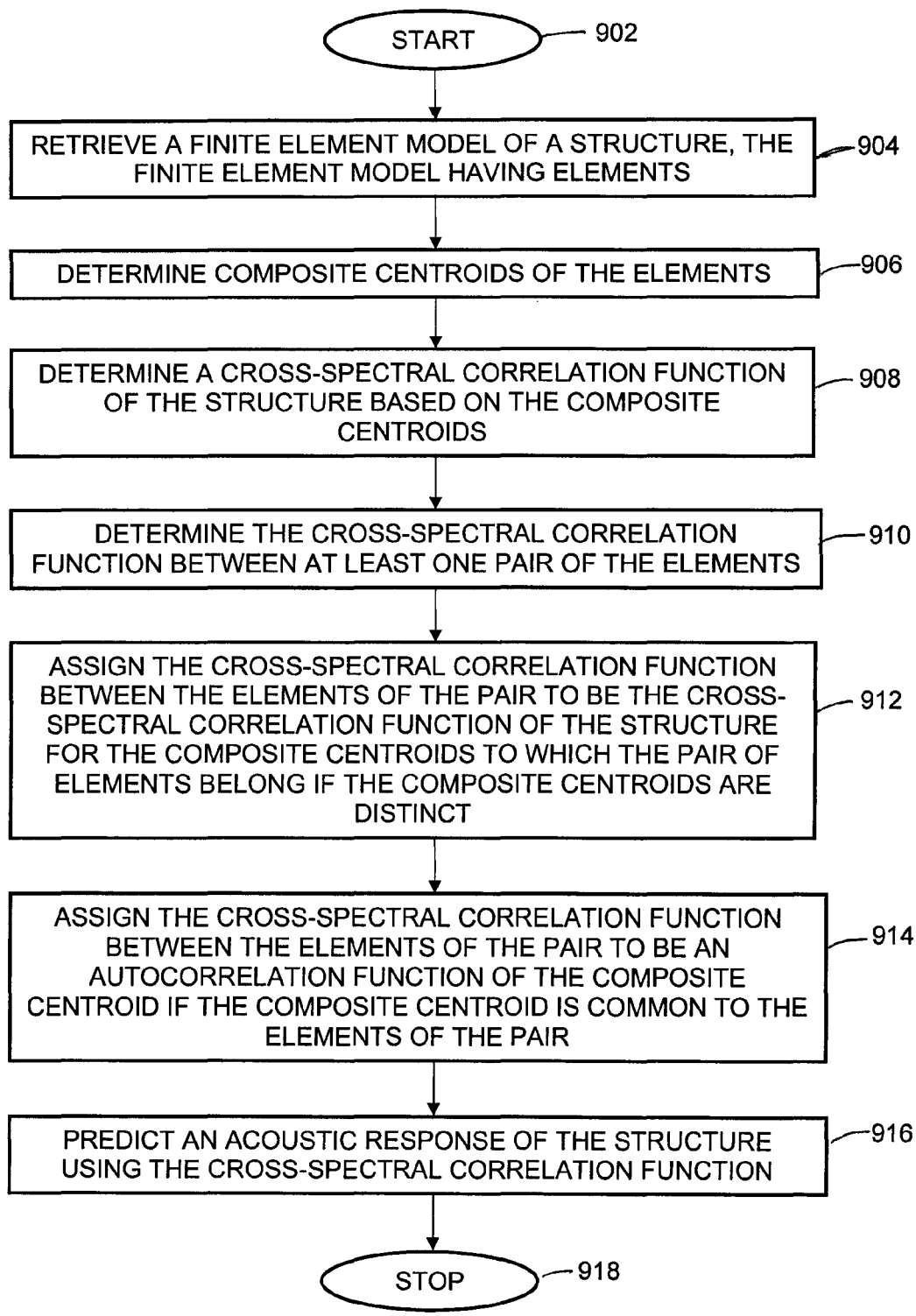
FIG. 9 is a flowchart outlining an exemplary operation for determining a cross-spectral correlation function of a structure.

More specifically, FIG. 9 is a flowchart outlining an operation for determining the cross-spectral correlation function of a structure for use in computing an acoustic response of the structure 200 (FIG. 2) by applying the cross-spectral correlation function to the finite element model of the structure. The process starts with step 902 and in step 904, the finite element model of the structure is retrieved or formed. The finite element model includes a plurality of the elements 300 (FIG. 3) with each element having a centroid 400 (FIG. 4) based upon the area of the element.

Figure 6B:

Step 906 comprises determining a plurality of composite centroids 600 (FIG. 6) wherein each one of the composite centroids is based on at least one of the elements. In this regard, the composite centroid may be based upon the centroid of a single element. The composite centroid may also be based upon two or more centroids that fall within a partitioned area such as the rectangular array 500 illustrated in FIGS. 5A and 6A or based upon other array configurations as described above. The elements may be partitioned based on the position of the centroid of each element. For example, the elements may be partitioned based upon the position of the centroid of each element relative to a collection of polygons that may be superimposed over the structure.

FIG. 5A is an example of partitioning based upon the position of the centroid of each element relative to a rectangular array superimposed over the structure in a manner as mentioned above. The array may be an M-by-N array of rectangles wherein M and N are integers having a value greater than 1. Each one of the composite centroids has a spatial position and an area. Each one of the centroids of the elements belongs to exactly one composite centroid. In this regard, each one of the composite centroids is formed from a set of the elements having no elements in common with sets of elements of other composite centroids.

Referring still to FIG. 9, step 908 comprises determining the cross-spectral correlation function of the structure based on the composite centroids as described above with reference to FIG. 8. Step 910 comprises determining the cross-spectral correlation function between at least one pair of the elements in the finite element model based upon the location of the elements in relation to the composite centroid.

In step 912, the cross-spectral correlation function of any two of the finite elements 300 (FIG. 3) may be defined to be the cross-spectral correlation function of the composite centroids that include the centroids 400 (FIG. 4) of the elements. In this regard, step 912 comprises assigning the cross-spectral correlation function between a pair of the elements to be the cross-spectral correlation function of composite centroids to which the pair of elements belongs if the composite centroids are distinct. For example, the cross-spectral correlation function between finite elements e1 and e2 (FIG. 3), where finite element e1 resides in composite panel P1 (FIG. 5A) and finite element e2 resides in composite panel P2 (FIG. 5A), is defined to be the cross-spectral correlation function between composite centroid panels P1 and P2.

Alternatively, in step 914 of FIG. 9, if the pair of elements is included in the same composite centroid (i.e., the same composite panel), then the cross-spectral correlation function between the elements is assigned to be the autocorrelation function of the composite centroid containing the pair of elements. In this regard, the autocorrelation function of a single composite centroid is based upon the panel area and centroid and is analogous to the calculation of the autocorrelation function of a single element based upon the element area and centroid. Upon assigning the cross-spectral correlation function, step 916 comprises predicting the acoustic response of the structure to the known acoustic field using the cross-spectral correlation function applied to the finite element model of the structure after which the process stops at step 918.

The present disclosure may further include a computer-readable storage medium for storing a plurality of instructions that, when executed by a processor, enable a processor-based system to operate on the finite element model. The finite element model has the plurality of elements which may also be formed from the structure using the element-forming device 140 (FIG. 1) described above. The instructions may use the cross-spectral correlation function to predict an acoustic response of the structure. The instructions stored within the computer-readable storage medium may include at least one object-oriented routine to create the cross-spectral correlation function for the structure using the elements. As indicated above, the acoustic model may be based upon the composite centroids of the elements which may be stored on the computer-readable storage medium.

The object-oriented routine for creating the acoustic model may include at least one object-oriented routine for creating the composite centroids from the elements. The object-oriented routine for creating the composite centroids may superimpose the rectangular array over the structure and partition the elements based upon the rectangular array. The instructions may also include a means such as the function determining device 180 (FIG. 1) as described above for determining the cross-spectral correlation function of the structure based on the composite centroids as described above.

The object-oriented routine for creating the composite centroids may include at least one object-oriented routine for determining the cross-spectral correlation function of the structure based on the composite centroids. Also included with the computer-readable storage may be a means for determining the cross-spectral correlation function of the structure between at least one pair of the elements in the finite element model. For example, the means for determining the cross-spectral correlation function of the structure may comprise the function determining device 180 (FIG. 1) described above. The function determining device 180 may assign the cross-spectral correlation function between the elements of the pair to be the cross-spectral correlation function of the structure for the composite centroids to which the pair of elements belongs if the composite centroids are distinct.

Alternatively, the function determining device 180 may assign the cross-spectral correlation function between the elements of the pair to be the autocorrelation function of the composite centroid if the composite centroid is common to the elements of the pair. The acoustic response of the structure to the known acoustic field may be predicted by using the cross-spectral correlation function applied to the finite element model of the structure in the manner described above.

Advantageously, the transfer of the acoustic model function (i.e., the cross-spectral correlation function) of the structure from the composite centroid model to the finite element model facilitates a significant reduction in the computational time required to calculate the acoustic function as compared to the computational time required in calculating the acoustic function of each pair of the finite elements. For example, for a quantity of N finite elements in a finite element model, approximately N×N/2 calculations are required to calculate the acoustic function directly on the finite element mesh. For finite element models having a quantity of N elements, there are approximately $N^2/2$ pairs of elements. Therefore, a finite element model having 1000 elements would require the calculation of approximately 500,000 acoustic functions.

However, if the acoustic function is performed on the larger grid of composite centroids (i.e., composite panels), approximately M×M/2 calculations are required to calculate the acoustic function wherein M represents the quantity of composite centroids or composite panels. As an illustration of the savings in computational time, in the example above containing 1000 finite elements, if there are 10 finite elements associated with each composite centroid or panel, then the total quantity of calculations required to determine the acoustic functions is reduced by a factor of approximately 100. In this example, the quantity of approximately 500,000 calculations can be reduced to approximately 5000 calculations Notably, accuracy in calculating the cross-spectral correlation function (i.e., the acoustic functions) as described above is generally maintained because the cross-spectral correlation functions generally vary slowly across the finite element model. For a more rapidly varying acoustic function, the partitions or composite panels can be reduced in size such that each one of the partitions or composite panels contains fewer finite elements.

Regarding the partitioning of the finite elements, while one may appropriately describe an M-by-N array as "rectangular" (or double-scripted), a more appropriate term for an M-by-N-by-P array might be a "pillar" array. Regardless of the technical term, for the purpose of this disclosure, a pillar array may be referred to as rectangular in nature.

While the various inventive aspects of this disclosure have been generally described with regard to two-dimensional systems, it should be appreciated that the disclosed methods and systems can be applicable for three dimensional analysis. Accordingly, when extrapolating the disclosed and implicit concepts from two to three dimensions, the appropriate nomenclature may change. For example, in a two-dimensional embodiment one might describe the various relevant elemental shapes as "lines"/"arcs", "triangles" and "squares" ("polygons" in general), whereas the three-dimensional equivalents might better be described as "tetrahedrons", "pentahedrons" and "hexahedrons" ("polyhedrons" in general). In a three-dimensional model, the cross-spectral correlation function is calculated for surfaces of the model that are exposed to the noise source. The methods of the embodiments disclosed herein would apply to calculation of the cross-spectral correlation function of such surfaces of the model.

In various embodiments where the above-described systems and/or methods are implemented using a programmable device, such as a computer-based system or programmable logic, it should be appreciated that the above-described systems and methods can be implemented using any of various known or later developed object or non-object oriented programming languages, such as "C", "C++", "FORTRAN", Pascal", "VHDL" and the like.

Accordingly, various storage media, such as magnetic computer disks, optical disks, electronic memories and the like, can be prepared that can contain information that can direct a device, such as a computer, to implement the above-described systems and/or methods. Once an appropriate device has access to the information and programs contained on the storage media, the storage media can provide the information and programs to the device, thus enabling the device to perform the above-described systems and/or methods.

For example, if a computer disk containing appropriate materials, such as a source file, an object file, an executable file or the like, were provided to a computer, the computer could receive the information, appropriately configure itself and perform the functions of the various systems and methods outlined in the diagrams and flowcharts above to implement the various functions. That is, the computer could receive various portions of information from the disk relating to different elements of the above-described systems and/or methods, implement the individual systems and/or methods and coordinate the functions of the individual systems and/or methods related to acoustic modeling.

The many features and advantages of the present disclosure are apparent from the detailed specification, and thus, it is intended by the appended claims to cover all such features and advantages of the present disclosure which fall within the true spirit and scope of the disclosure. Further, since numerous modifications and variations will readily occur to those skilled in the art, it is not desired to limit the disclosure to the exact construction and operation illustrated and described, and accordingly, all suitable modifications and equivalents may be resorted to, falling within the scope of the disclosure.

What is claimed is:

1. A method of determining a cross-spectral correlation function for use in computing an acoustic response of a structure to a known acoustic field, the method being performed by computer-executable instructions stored on a computer readable storage media that, when executed on a processor, perform a method comprising:
    retrieving a finite element model of the structure having a plurality of elements with each element having a centroid;
    determining a plurality of composite centroids, each one of the composite centroids being based on at least one of the elements and having a spatial position;
    determining a cross-spectral correlation function of the structure based on the composite centroids; and
    determining the cross-spectral correlation function between at least one pair of the elements in the finite element model by performing the following:
        assigning the cross-spectral correlation function between the elements of the pair to be the cross-spectral correlation function of the structure for the composite centroids to which the pair of elements belongs if the composite centroids are distinct;
        assigning the cross-spectral correlation function between the elements of the pair to be an autocorrelation function of the composite centroid if the composite centroid is common to the elements of the pair;
    wherein the acoustic response of the structure to the known acoustic field may be predicted using the cross-spectral correlation function applied to the finite element model of the structure.

2. The method of claim 1 further comprising the step of:
    calculating the spatial distance between at least one pair of composite centroids;
    the step of determining the cross-spectral correlation function being based on the calculated spatial distance.

3. The method of claim 1 wherein each one of the elements of the finite element model belongs to exactly one of the composite centroids.

4. The method of claim 1 wherein each one of the composite centroids is formed from a set of the elements having no elements in common with sets of elements of other composite centroids.

5. The method of claim 1 wherein each one of the centroids of each element comprises one of the composite centroids.

6. The method of claim 1 wherein the elements are partitioned based on the position of the centroid of each element.

7. The method of claim 6 wherein the elements are partitioned based on the position of the centroid of each element relative to a collection of polygons superimposed over the structure.

8. The method of claim 7 wherein the elements are partitioned based on the position of the centroid of each element relative to an array superimposed over the structure.

9. The method of claim 8 wherein the array is an M-by-N array of rectangles, M and N being integers having a value greater than 1.

10. The method of claim 9 wherein the step of determining the plurality of composite centroids is performed using at least one object-oriented software routine to manipulate at least one of the rectangular array of elements and a rectangular array of the composite centroids.

11. The method of claim 1 wherein the step of determining the plurality of composite centroids is performed using at least one object-oriented software routine.

12. The method of claim 1 wherein the elements are derived based on a non-Cartesian coordinate system.

13. An apparatus for determining a cross-spectral correlation function for use in computing an acoustic response of a structure to a known acoustic field, a source of excitation being coupled with the structure based on a finite-element model of the structure, the apparatus comprising:
 a processor;
 a memory containing computer-executable instructions that, when executed on the processor, perform a method comprising the steps of:
  retrieving a finite element model of the structure having a plurality of elements with each element having a centroid;
  determining a plurality of composite centroids, each one of the composite centroids being based on at least one of the elements and having a spatial position;
  determining a cross-spectral correlation function of the structure based on the composite centroids; and
  determining the cross-spectral correlation function between at least one pair of the elements in the finite element model by performing the following:
   assigning the cross-spectral correlation function between the elements of the pair to be the cross-spectral correlation function of the structure for the composite centroids to which the pair of elements belongs if the composite centroids are distinct;
   assigning the cross-spectral correlation function between the elements of the pair to be an autocorrelation function of the composite centroid if the composite centroid is common to the elements of the pair;
  wherein the acoustic response of the structure to the known acoustic field may be predicted using the cross-spectral correlation function applied to the finite element model of the structure.

14. The apparatus of claim 13 wherein the method further comprises the step of:
 calculating the spatial distance between at least one pair of composite centroids;
 the step of determining the cross-spectral correlation function being based on the calculated spatial distance.

15. The apparatus of claim 13 wherein each one of the elements of the finite element model belongs to exactly one of the composite centroids.

16. The apparatus of claim 13 wherein each one of the composite centroids is formed from a set of the elements having no elements in common with sets of elements of other composite centroids.

17. The apparatus of claim 13 wherein each one of the centroids of each element comprises one of the composite centroids.

18. The apparatus of claim 13 wherein the elements are partitioned based on the position of the centroid of each element relative to an array superimposed over the structure.

19. The method of claim 18 wherein the array is an M-by-N array of rectangles, M and N being integers having a value greater than 1.

20. The method of claim 13 wherein the step of determining the plurality of composite centroids is performed using at least one object-oriented software routine to manipulate at least one of the rectangular array of elements and a rectangular array of the composite centroids.

21. The method of claim 13 wherein the elements are derived based on a non-Cartesian coordinate system.

22. A non-transitory computer-readable storage medium for storing a plurality of instructions that, when executed by a processor, enable a processor-based system to operate on a finite element model representing a structure having a plurality of elements in determining a cross-spectral correlation function for use in computing an acoustic response of the structure, the instructions comprising:
 at least one object-oriented routine that, when executed by the processor, creates the cross-spectral correlation function for the structure using the elements of the finite element model based upon composite centroids of the elements stored on the computer-readable storage medium;
 a means for determining the cross-spectral correlation function of the structure based on the composite centroids; and
 a means for determining the cross-spectral correlation function between at least one pair of the elements in the finite element model by performing the following:
  assigning the cross-spectral correlation function between the elements of the pair to be the cross-spectral correlation function of the structure for the composite centroids to which the pair of elements belongs if the composite centroids are distinct;
  assigning the cross-spectral correlation function between the elements of the pair to be an autocorrelation function of the composite centroid if the composite centroid is common to the elements of the pair;
 wherein the acoustic response of the structure to a known acoustic field may be predicted using the cross-spectral correlation function applied to the finite element model of the structure.

23. The non-transitory storage medium of claim 22 wherein the object-oriented routine includes at least one object-oriented routine that creates the composite centroids from the elements.

24. The non-transitory storage medium of claim 23 wherein the object-oriented routine for creating the composite centroids superimposes a rectangular array over the structure and partition the elements based upon the rectangular array.

25. The non-transitory storage medium of claim 22 wherein the object-oriented routine for creating the composite centroids includes at least one object-oriented routine that determines the cross-spectral correlation function of the structure based on the composite centroids.

\* \* \* \* \*